United States Patent
Kim et al.

(10) Patent No.: US 12,386,471 B2
(45) Date of Patent: Aug. 12, 2025

(54) TOUCH PANEL AND DISPLAY DEVICE INCLUDING THE SAME

(71) Applicant: Samsung Display Co., Ltd., Yongin-Si (KR)

(72) Inventors: Ki Cheol Kim, Yongin-si (KR); Won Jun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/581,394

(22) Filed: Feb. 20, 2024

(65) Prior Publication Data

US 2025/0021200 A1  Jan. 16, 2025

(30) Foreign Application Priority Data

Jul. 10, 2023  (KR) .................. 10-2023-0089382

(51) Int. Cl.
   *G06F 3/044*  (2006.01)
   *G06F 3/041*  (2006.01)
   *H10K 59/40*  (2023.01)
   *H10K 59/80*  (2023.01)

(52) U.S. Cl.
   CPC .......... *G06F 3/0446* (2019.05); *G06F 3/0416* (2013.01); *H10K 59/40* (2023.02); *H10K 59/8791* (2023.02); *G06F 2203/04111* (2013.01); *G06F 2203/04112* (2013.01)

(58) Field of Classification Search
   CPC .................. G06F 3/0446; G06F 3/0416; G06F 2203/04111; G06F 2203/04112; G06F 3/0412; G06F 3/04164; G06F 3/0443; G06F 3/047; H10K 59/40; H10K 59/8791
   See application file for complete search history.

(56) References Cited

U.S. PATENT DOCUMENTS

| 11,698,696 B1 * | 7/2023 | Jin .................. G06F 3/0412 345/173 |
| 11,720,215 B2 | 8/2023 | Wang et al. |
| 2014/0368755 A1 * | 12/2014 | Chen .................. G06F 3/0448 349/12 |
| 2016/0378224 A1 * | 12/2016 | Kwon .................. H10K 59/8731 345/174 |
| 2023/0041492 A1 | 2/2023 | Hong et al. |

FOREIGN PATENT DOCUMENTS

| CN | 113867570 A | 12/2021 |
| KR | 10-1123542 B1 | 3/2012 |
| KR | 10-2023-0021196 A | 2/2023 |
| WO | 2009046363 A1 | 4/2009 |

* cited by examiner

*Primary Examiner* — Brent D Castiaux
(74) *Attorney, Agent, or Firm* — Innovation Counsel LLP

(57) ABSTRACT

An embodiment provides a display panel including: a base substrate; a touch electrode disposed on the base substrate; and a connection wire that connects the touch electrode to a touch panel driver, wherein a width of a first conductive pattern forming the touch electrode is different from a width of a second conductive pattern forming the connection wire.

20 Claims, 15 Drawing Sheets

FIG. 11
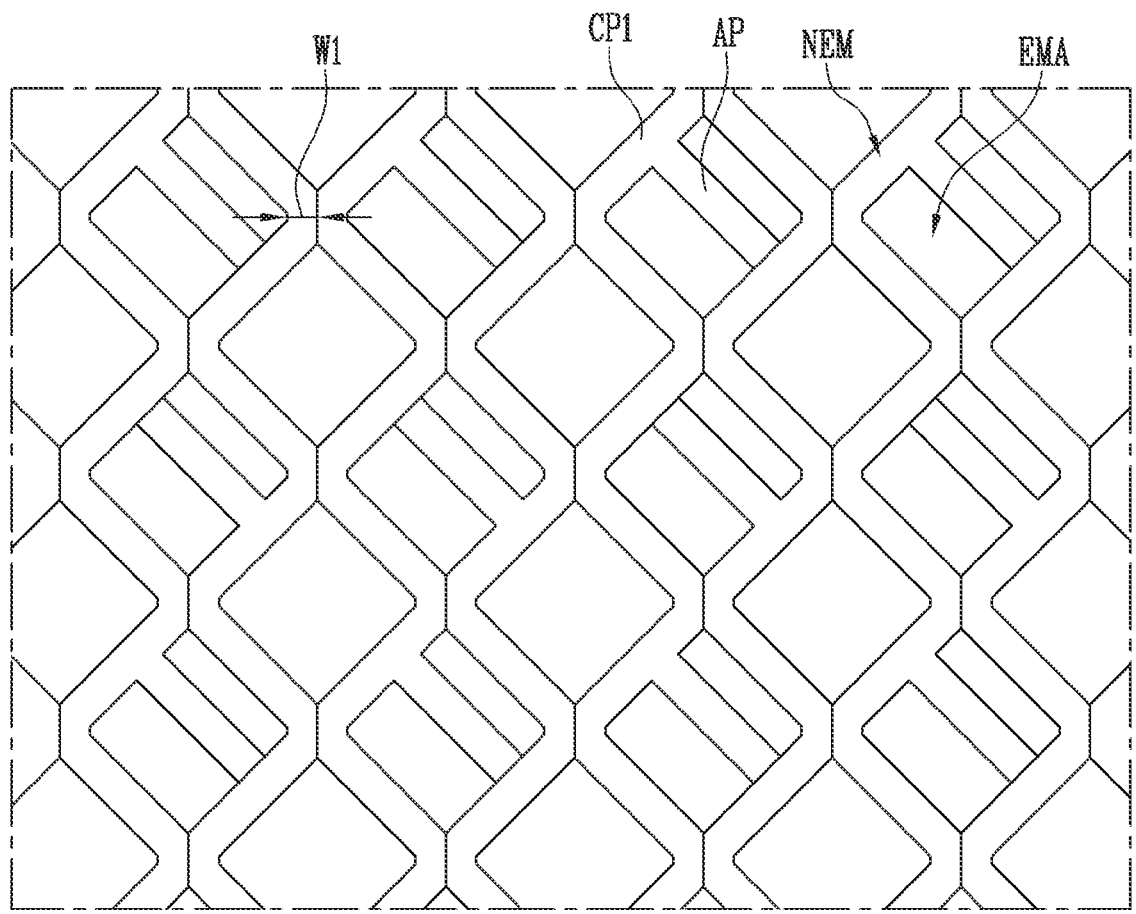
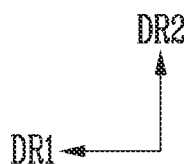

TOUCH PANEL AND DISPLAY DEVICE INCLUDING THE SAME

CROSS-REFERENCE TO RELATED APPLICATION

This application claims priority to and the benefit of Korean Patent Application No. 10-2023-0089382 filed in the Korean Intellectual Property Office on Jul. 10, 2023, the entire contents of which are incorporated herein by reference.

BACKGROUND OF THE INVENTION

(a) Field of the Invention

The present disclosure relates to a touch panel and a display device including the same.

(b) Description of the Related Art

Generally, a touch panel is a panel provided on an upper side of a display device to be directly contacted with a hand or an object so that instructions displayed on a screen of the display device may be selected by a person's hand or an object. A display device having a touch panel uses the touch panel to recognize a touched position, receives an instruction from the touched position as an input signal, and operates according to the input signal.

Display devices having touch panels are increasingly being used because they do not require a separate input device such as a keyboard and a mouse.

A touch panel may be used in a display device, and in this case, the touch panel may be on an upper side of the display panel displaying an image where the touch panel may receive a predetermined input from a user to detect position information.

SUMMARY OF THE INVENTION

One object of the present disclosure is to provide a touch panel with improved touch sensitivity.

Another object of the present disclosure is to provide a display device including a touch panel.

An embodiment of the present disclosure provides a display panel including: a base substrate; a touch electrode disposed on the base substrate; and a connection wire that connects the touch electrode to a touch panel driver, wherein a width of a first conductive pattern forming the touch electrode is different from a width of a second conductive pattern forming the connection wire.

The width of the first conductive pattern may be wider than the width of the second conductive pattern.

The width of the first conductive pattern may be greater than about 3 μm, and the width of the second conductive pattern may be smaller than about 3 μm.

The touch panel may further include a light blocking member disposed on the touch electrode, and a color filter disposed at a position corresponding to an opening defined by the light blocking member.

A width of the light blocking member may be wider than at least one of the width of the first conductive pattern and the width of the second conductive pattern.

The connection wire may be adjacent to the touch electrode in a first direction, and the touch electrode may further include a protruding portion that protrudes in a second direction crossing the first direction.

The connection wire may be adjacent to the touch electrode in a first direction, and a portion of the connection wire may further include a protruding portion that protrudes in a second direction crossing the first direction.

The touch panel may further include a dummy pattern disposed between second conductive patterns including the second conductive pattern.

The touch panel may further include first conductive patterns including the first conductive pattern, wherein at least some of the first conductive patterns may be in contact with each other.

The connection wire may include a first connection wire extending in a first direction and a second connection wire extending in a second direction crossing the first direction, and at least some of second conductive patterns including the second conductive pattern forming the first connection wire may be in contact with each other.

The connection wire may include a first connection wire extending in a first direction and a second connection wire extending in a second direction crossing the first direction, and at least some of second conductive patterns including the second conductive pattern forming the second connection wire may be spaced apart from each other.

The first conductive pattern may include an additional pattern overlapping a light emitting area.

The touch panel may further include a dummy pattern overlapping a light emitting area in a trace area including the second conductive pattern.

The touch panel may further include touch electrodes including the touch electrode, wherein sizes of the touch electrodes may be the same.

The touch electrode and the connection wire may be formed on the same layer.

The touch electrode and the connection wire may be formed on different layers.

The touch panel may further include touch electrodes including the touch electrode, wherein the connection wire may be adjacent to the touch panel driver in a second direction, and sizes of the touch electrodes may decrease in a direction opposite to the second direction.

Another embodiment of the present disclosure provides a display device including: a display panel; a touch panel provided on one surface of the display panel; a display panel driver that drives the display panel; and a touch panel driver that drives the touch panel, wherein the touch panel includes a base substrate; a touch electrode disposed on the base substrate; and a connection wire that connects the touch electrode to the touch panel driver, and a width of a first conductive pattern forming the touch electrode is different from a width of a second conductive pattern forming the connection wire.

The width of the first conductive pattern may be wider than the width of the second conductive pattern.

The touch panel may further include a light blocking member disposed on the touch electrode; and a color filter disposed at a position corresponding to an opening defined by the light blocking member, and a width of the light blocking member may be greater than at least one of the width of the first conductive pattern and the width of the second conductive pattern.

The touch panel according to the embodiments of the present disclosure may increase capacitance between a touch electrode and an object (for example, a human finger) by increasing a width of a first conductive pattern forming the touch electrode. Accordingly, touch sensitivity may be improved.

The touch panel according to the embodiments of the present disclosure may reduce capacitance between a connection wire and a cathode electrode by reducing a width of a second conductive pattern forming the connection wire. Accordingly, touch sensitivity may be improved.

However, the effects of the present disclosure are not limited to the above-described effects and may be variously extended without departing from the spirit and scope of the present disclosure.

BRIEF DESCRIPTION OF THE DRAWINGS

FIG. 11 illustrates a first conductive pattern of a display device according to embodiments of the present disclosure.

DETAILED DESCRIPTION OF THE EMBODIMENTS

Figure 1:
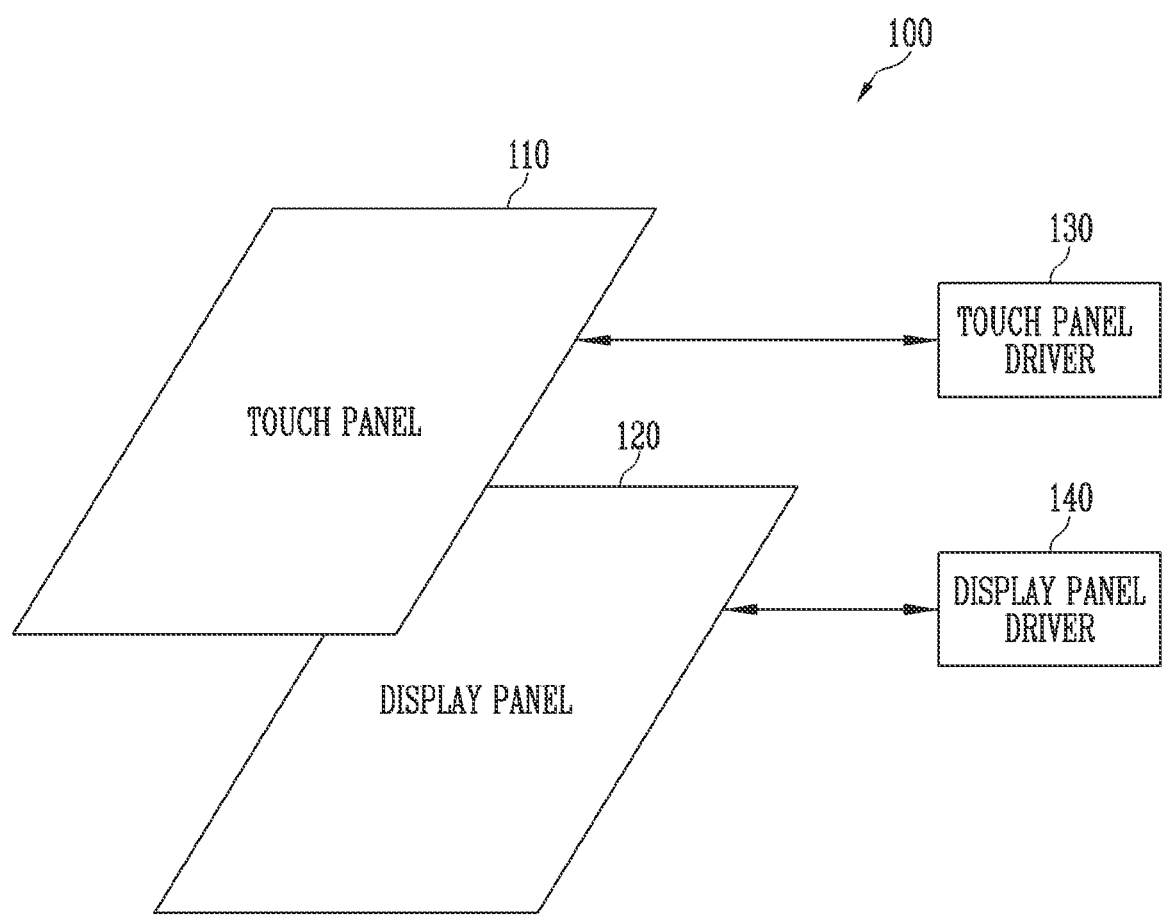
FIG. 1 illustrates a display device according to an embodiment of the present disclosure.

Hereinafter, example embodiments of the present disclosure will be described in detail with reference to the accompanying drawings. The following description is intended to enable understanding of the principles and operation of specific embodiments of the disclosure, and any other disclosure may be omitted to avoid obscuring the disclosure of more relevant concepts. In addition, the disclosed concept may be embodied in different forms and is not limited to the embodiments set forth herein. The embodiments described herein are provided for the purpose of describing the technical concepts of the disclosure in sufficient detail for those skilled in the art to easily practice them.

Throughout the specification, when it is described that an element is "connected" to another element, this includes not only being "directly connected", but also being "indirectly connected" with another device in between. Throughout the specification, unless explicitly described to the contrary, the word "comprise" and variations such as "comprises" or "comprising" will be understood to imply the inclusion of stated elements but not the exclusion of any other elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various constituent elements, these constituent elements should not be limited by these terms. These terms are used to distinguish one constituent element from another constituent element. Thus, a first constituent element discussed below could be termed a second constituent element without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or at other orientations), and, as such, the spatially relative descriptors used herein interpreted accordingly.

Various embodiments are described herein with reference to sectional illustrations that are schematic illustrations of idealized embodiments. As such, variations from the shapes of the illustrations as a result, for example, of manufacturing techniques and/or tolerances, are to be expected. Thus, embodiments disclosed herein should not be construed as limited to the particular illustrated shapes of regions but are to include deviations in shapes that result from, for instance, manufacturing. Additionally, the regions illustrated in the drawings may be schematic in nature, and their shapes may not be intended to illustrate the actual shape of a region of a device and are not intended to be limiting.

FIG. 1 illustrates a display device according to an embodiment of the present disclosure.

Referring to FIG. 1, a display device 100 may include a touch panel 110, a display panel 120, a touch panel driver 130, and a display panel driver 140.

FIG. 1 shows the touch panel 110 and the display panel 120 separated from each other. However, this separation is only for functionally distinguishing the touch panel 110 and the display panel 120 in the display device 100. For example, the touch panel 110 may be formed in a separate process from the display panel 120, and the touch panel 110 and the display panel 120 may be coupled to each other (for example, the touch panel 110 may be attached to and coupled to one surface of the display panel 120). That is, the touch panel 110 may be an add-on type. Alternatively, the touch panel 110 and the display panel 120 may be formed in one process (for example, a process of manufacturing the display panel 120). That is, the touch panel 110 may be an in-cell type.

The touch panel 110 may be on one surface of the display panel 120. For example, the touch panel 110 may be disposed on one surface (for example, an upper surface) from which the display panel 120 projects an image. In another embodiment, the touch panel 110 may be directly formed on at least one surface of the display panel 120 or formed inside the display panel 120. For example, the touch panel 110 may be directly formed on an outer surface of an upper or lower substrate of the display panel 120 (that is, an upper surface of an upper substrate or a lower surface of a lower substrate), or may be formed directly on an inner surface of the upper substrate (that is, a lower surface of the upper substrate) or an inner surface of the lower substrate (that is, an upper surface of the lower substrate).

The touch panel 110 may include a touch area capable of detecting a touch and a non-touch area disposed outside the touch area (for example, a peripheral area or edge area of the touch area). In an embodiment, the touch area may be disposed to correspond to the display area of the display panel 120.

In an embodiment, the touch panel 110 may be disposed so that at least part of the touch panel 110 overlaps the display panel 120. For example, the touch area of the touch panel 110 may be disposed on the display area of the display panel 120. In the embodiment, at least one electrode for detecting a touch may be disposed in the touch area.

The non-touch area may contain wires for electrically connecting at least one electrode provided in the touch area to the touch panel driver 130. The non-touch area of the touch panel 110 may be disposed to correspond to or overlap the non-display area of the display panel 120.

The display panel 120 includes a display area (DA in FIG. 3) and a non-display area (NDA in FIG. 3) disposed outside the display area (for example, an edge area or a peripheral area of the display area).

Figure 3:
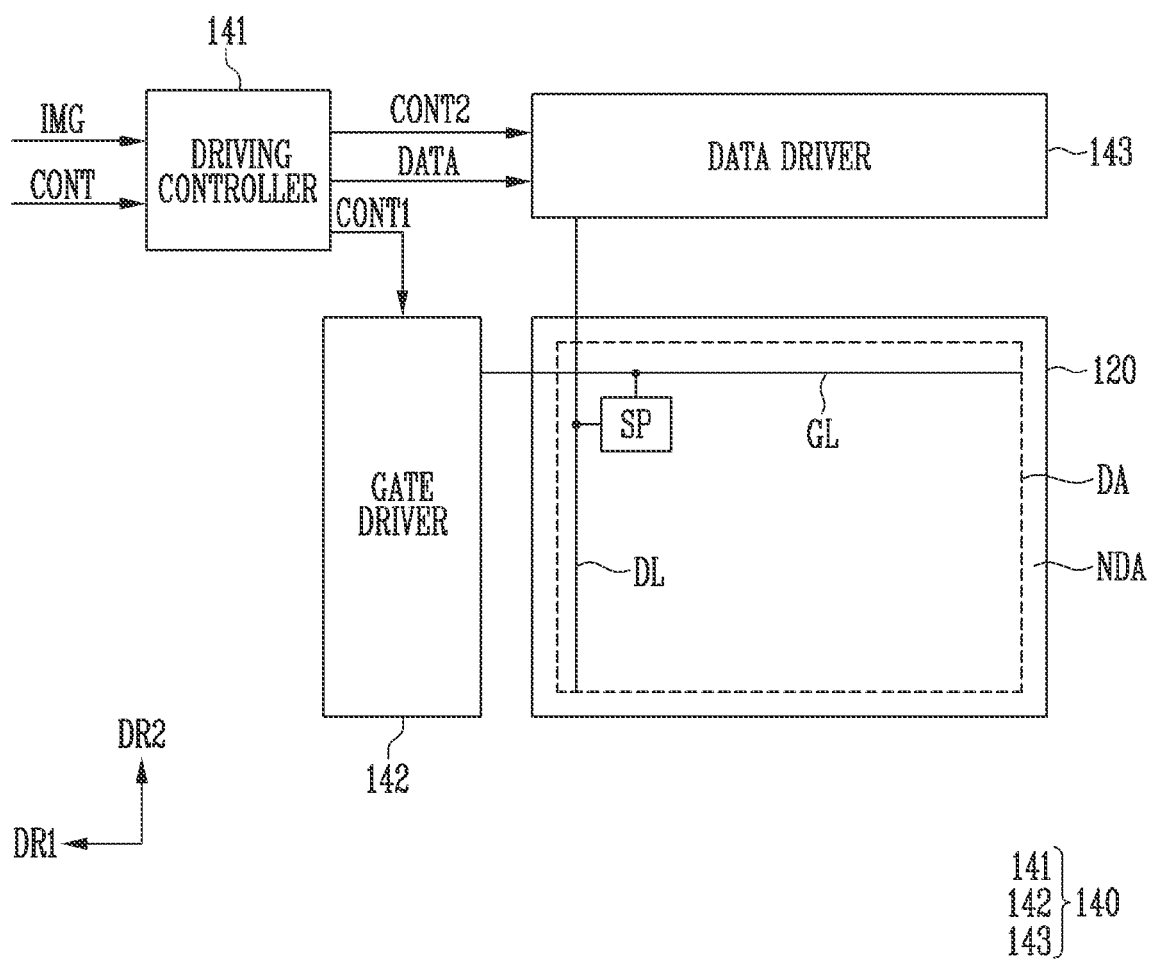
FIG. 3 illustrates a block diagram of an example of a display panel and a display panel driver of FIG. 1.

The display area may contain a gate line (GL in FIG. 3), a data line (DL in FIG. 3), and a sub-pixel (SP in FIG. 3) electrically connected to the gate line (GL in FIG. 3) and the data line (DL in FIG. 3). The non-display area (NDA in FIG. 3) may contain wires for supplying various driving signals and/or power for driving the sub-pixel (SP in FIG. 3).

The present disclosure is not limited to a particular type of display panel 120. For example, the display panel 120 may be a self-emitting display panel. For example, the display panel 120 may include a plurality of light emitting elements. For example, the light emitting element may be an organic light emitting diode. For example, the light emitting element may be an inorganic light emitting diode such as a micro light emitting diode (LED) or a quantum dot light emitting diode. For example, the light emitting element may be an element in which an organic material and an inorganic material are combined. For example, the display panel 120 may be a non-light emitting display panel such as a liquid crystal display panel (LCD panel), an electro-phoretic display panel (EPD panel), or an electro-wetting display panel (EWD panel). When the display panel 120 is a non-light emitting display panel, the display device 100 may further include a backlight unit for supplying light to the display panel 120.

The touch panel driver 130 may be connected to the touch panel 110 to transmit or input a signal to the touch panel 110 or receive a signal output from the touch panel 110. In an embodiment, the touch panel driver 130 may detect a touch by supplying a touch driving signal to the touch panel 110 and then receiving a touch sensing signal corresponding to the touch driving signal from the touch panel 110. In an embodiment, the touch panel driver 130 may detect a touch by supplying a touch driving signal to a capacitor electrically connected to a touch electrode of the touch panel 110 and then receiving a touch sensing signal from the touch panel 110. To this end, the touch panel driver 130 may include a touch driving signal transmitting portion and a touch sensing signal receiving portion. In the embodiment, the touch driving signal transmitting portion and the touch sensing signal receiving portion may be integrated into one integrated circuit (IC), but the present disclosure is not limited thereto.

The display panel driver 140 may be connected to the display panel 120 to supply a signal to the display panel 120 or receive a signal from the display panel 120. The display panel driver 140 may, for example, supply a gate signal to a gate line and supply a data voltage to a data line.

Figure 2:
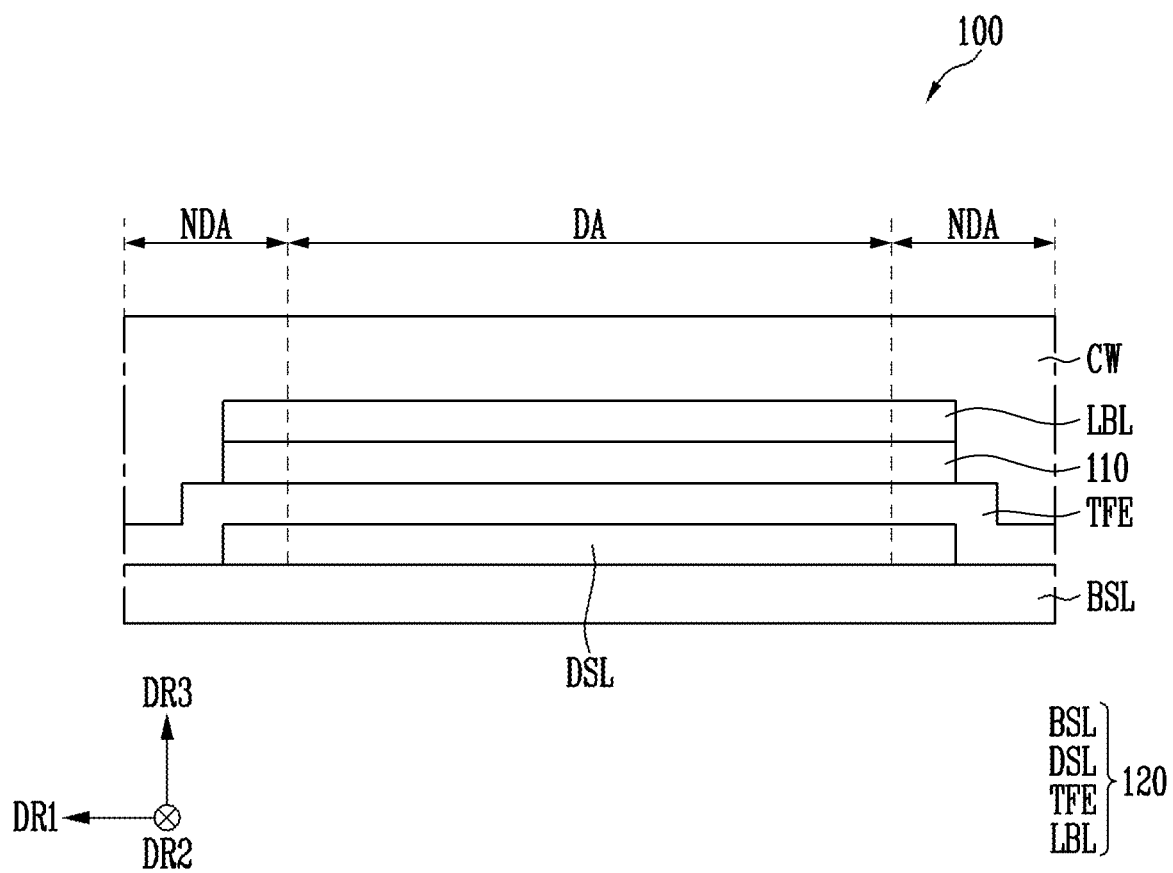
FIG. 2 illustrates a cross-sectional view of an example of the display device of FIG. 1.

FIG. 2 shows a cross-sectional view of an example of the display device of FIG. 1.

Referring to FIG. 2, the display device 100 may include the display panel 120 and the touch panel 110 on the display panel 120. A cover window CW may be on the touch panel 110.

FIG. 2 illustrates an example in which the display panel 120 is a self-emitting display panel including a light emitting element. However, the present disclosure is not limited to the type of display panel 120.

The display panel 120 may include a first base substrate BSL, an element layer DSL, an encapsulation layer TFE, and a light blocking layer LBL.

The first base substrate BSL may support the element layer DSL. The first base substrate BSL may include an insulating material. As an example of the insulating material, at least one of glass, quartz, ceramic, and plastic may be included. The first base substrate BSL may be a rigid substrate or a flexible substrate.

The element layer DSL may be disposed on the first base substrate BSL. The element layer DSL may include a sub-pixel and a signal line disposed on the first base substrate BSL. The sub-pixel may include a thin film transistor (TFT) and a capacitor. In the illustrated embodiment, the sub-pixel may include a light emitting element electrically connected to the thin film transistor and/or the capacitor. The signal line may include a gate line configured to transmit a gate signal to a sub-pixel and a data line configured to transmit a data voltage. A sub-pixel included in the element layer DSL may be disposed in the display area DA of the display device 100. A common electrode (for example, a cathode electrode of a light emitting element or a common electrode of a liquid crystal display) may be formed in the element layer DSL.

The encapsulation layer TFE may be disposed on the element layer DSL. The encapsulation layer TFE may protect the element layer DSL from external moisture and/or oxygen. The encapsulation layer TFE may include two or more thin film layers formed on the element layer DSL. For example, the encapsulation layer TFE may include an inorganic thin film layer formed on the element layer DSL, an organic thin film layer formed on the inorganic thin film layer, and an inorganic thin film layer disposed on the organic thin film layer. In an embodiment, the encapsulation layer TFE may include a glass substrate to cover the element layer DSL. The encapsulation layer TFE may cover the element layer DSL in the display area DA and the non-display area NDA.

The touch panel 110 may be disposed on the encapsulation layer TFE. In an embodiment, the touch panel 110 may be directly formed on the encapsulation layer TFE. In an embodiment, the touch panel 110 may be formed through a process separate from the display panel 120 to be disposed (for example, attached) on the encapsulation layer TFE. The touch panel 110 may have a touch area in at least a portion of an area overlapping the display area DA. The touch panel 110 may have a non-touch area in at least a portion of an area overlapping the non-display area NDA.

The light blocking layer LBL may include a color filter (CF in FIG. 4) and a light blocking member (BM in FIG. 4) as described further below.

The cover window CW may be disposed on the touch panel 110. The cover window CW may protect the display panel 120 and the touch panel 110 from external impact. The cover window CW may be implemented with a film of a light transmissive (for example, transparent) material, for example, a glass material and/or a plastic material.

FIG. 3 illustrates a block diagram of an example of a display panel and a display panel driver of FIG. 1.

Referring to FIG. 3, the display device may include the display panel 120 and the display panel driver 140. The display panel driver 140 may include a driving controller 141, a gate driver 142, and a data driver 143. In an embodiment, the driving controller 141 and data driver 143 may be integrated on a single chip.

The display panel 120 may include a display area DA displaying an image and a non-display area NDA disposed adjacent to the display area DA. In an embodiment, the gate driver 142 may be mounted in the non-display area NDA.

The display panel 120 may include a plurality of gate lines GL, a plurality of data lines DL, and a plurality of sub-pixels SP electrically connected to the gate lines GL and the data lines DL. The gate lines GL may extend in a first direction DR1, and the data lines DL may extend in a second direction DR2 crossing the first direction DR1.

The driving controller 141 may receive input image data IMG and an input control signal CONT from a main processor (for example, a graphic processing unit (GPU) and the like). In an embodiment, the input image data IMG may include red image data, green image data, and blue image data. In an embodiment, the input image data IMG may further include white image data. In another example, the input image data IMG may include magenta image data, yellow image data, and cyan image data. The input control signal CONT may include a master clock signal and a data enable signal. The input control signal CONT may further include a vertical synchronization signal and a horizontal synchronization signal.

The driving controller 141 may generate a first control signal CONT1, a second control signal CONT2, and a data signal DATA based on the input image data IMG and the input control signal CONT.

The driving controller 141 may generate the first control signal CONT1 for controlling the operation of the gate driver 142 based on the input control signal CONT and may output the first control signal CONT1 to the gate driver 142. The first control signal CONT1 may include a vertical start signal and a gate clock signal.

The driving controller 141 may generate the second control signal CONT2 for controlling the operation of the data driver 143 based on the input control signal CONT and may output the second control signal CONT2 to the data driver 143. The second control signal CONT2 may include a horizontal start signal and a load signal.

The driving controller 141 may receive and use the input image data IMG and the input control signal CONT to generate the data signal DATA. The driving controller 141 may output the data signal DATA to the data driver 143.

The gate driver 142 may generate gate signals for driving the gate lines GL in response to the first control signal CONT1 received from the driving controller 141. The gate driver 142 may output the gate signals to the gate lines GL. For example, the gate driver 142 may sequentially output or assert the gate signals to the gate lines GL.

The data driver 143 may receive the second control signal CONT2 and the data signal DATA from the driving controller 141. The data driver 143 may generate data voltages obtained by converting each digital value of the data signal DATA into an analog voltage. The data driver 143 may output the data voltages to the data lines DL.

Figure 4:
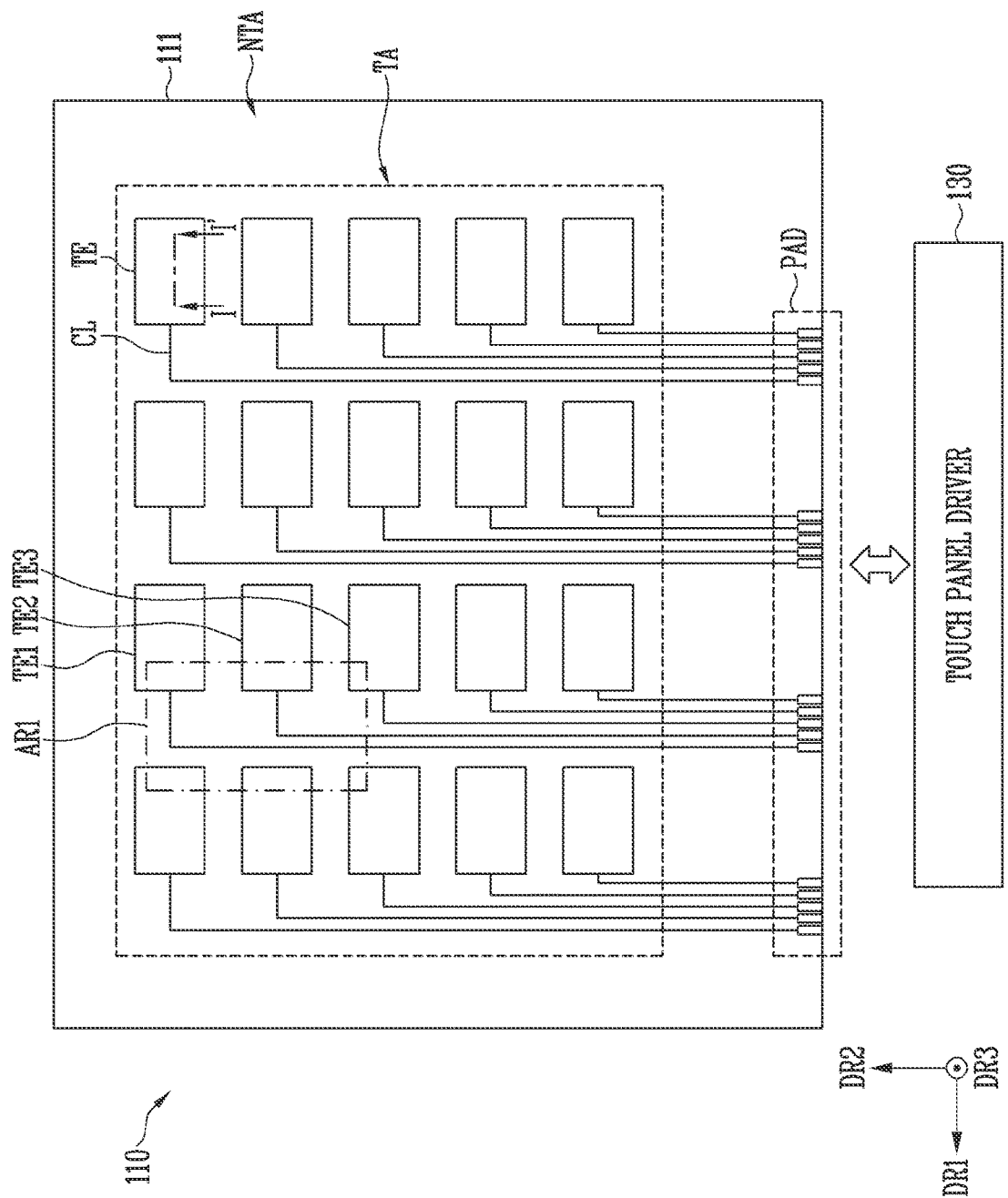
FIG. 4 illustrates a block diagram of an example of a touch panel of FIG. 1.

FIG. 4 illustrates a block diagram of an example of a touch panel of FIG. 1.

Referring to FIG. 4, the touch panel 110 may include a second base substrate 111, touch electrodes TE, a pad portion PAD, and connection wires CL.

The second base substrate 111 is a substrate used as a substrate for the touch panel 110 and may be a rigid or flexible substrate. For example, the second base substrate 111 may be a rigid substrate including glass or tempered glass, or a flexible substrate including a thin film of a flexible plastic material. The touch electrodes TE, the pad portion PAD, and the connection wires CL may be disposed on the second base substrate 111. In an embodiment, the second base substrate 111 may be omitted (or replaced with another component). For example, when the touch electrode TE is directly formed on the display panel (120 in FIG. 1), the second base substrate 111 may be replaced with the first base substrate (BSL in FIG. 2) or the encapsulation layer (TFE in FIG. 2) described above.

The touch electrodes TE may be disposed in the touch area TA. The touch electrodes TE may be arranged in an array extending in the first direction DR1 and the second direction DR2. For example, the touch electrodes TE may be disposed in a row direction and a column direction. However, the present disclosure is not limited to the shape, size, and/or disposition direction of the touch electrode TE.

In an embodiment, the touch panel driver 130 may detect a touch by supplying a touch driving signal to the touch panel 110 and receiving a touch sensing signal corresponding to the touch driving signal from the touch panel 110. In an embodiment, the touch panel driver 130 may detect a touch by supplying a touch driving signal to a capacitor electrically connected to the touch electrode TE (or the connection wire CL) and receiving a touch sensing signal corresponding to the touch driving signal from the touch panel 110.

When an object (for example, a human finger) approaches one of the touch electrodes TE, capacitance may be formed between the touch electrode TE and the object (for example, human finger). Then, as the capacitance changes, the touch sensing signal changes, and the touch panel driver 130 may detect the touch by detecting a change in the touch sensing signal.

The pad portion PAD may be disposed in the non-touch area NTA of the touch panel 110. The pad portion PAD may include one or more pads. Each pad may connect a corresponding touch electrode TE to the touch panel driver 130. The connection wires CL may electrically connect the pad portion PAD and the touch electrodes TE.

In an embodiment, the touch electrodes TE and the connection wires CL may be formed on the same layer. In an embodiment, the touch electrodes TE may each have the same size. In the illustrated example, the connection wires CL may extend in the second direction DR2 and be connected to the associated touch electrodes TE in the first direction DR1.

In an embodiment, the touch electrodes TE and the connection wires CL may be formed on different layers. For example, unlike shown in FIG. 4, the touch electrodes TE and the connection wires CL may overlap. In this case, a trace area that contains the connection wires CL may be reduced in size.

Figure 5:
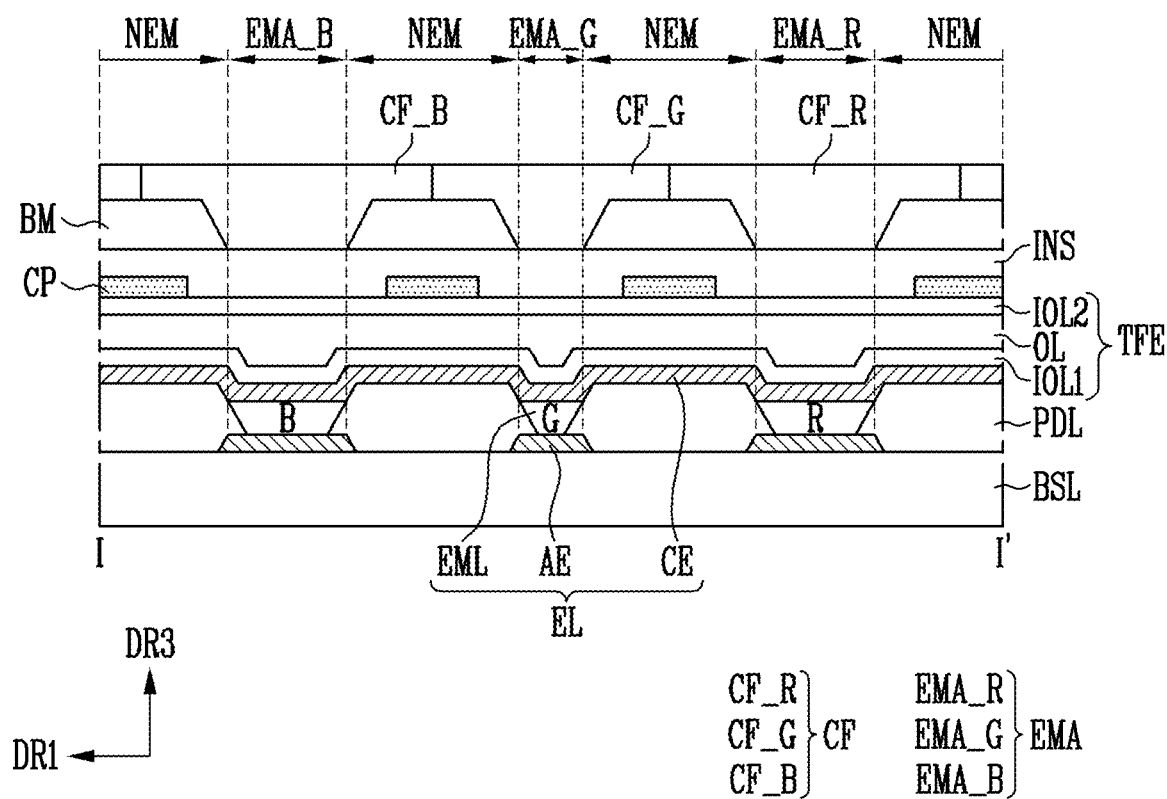
FIG. 5 illustrates a cross-sectional view taken along line I-I' of FIG. 4.

FIG. 5 illustrates a cross-sectional view taken along line I-I' of FIG. 4.

Referring to FIG. 4 and FIG. 5, a pixel defining film PDL, a light emitting element EL, an encapsulation layer TFE, a conductive pattern CP, an insulating layer INS, a light blocking member BM, and a color filter CF may be disposed on the first base substrate BSL. The pixel defining film PDL and the light emitting element EL may be included in the above-described element layer (DSL in FIG. 2). The conductive pattern CP and the insulating layer INS may be included in the above-described touch panel (110 in FIG. 2).

The light emitting element EL may include a first electrode AE, a second electrode CE, and a light emitting layer EML. The light emitting layer EML is disposed between the first electrode AE and the second electrode CE. Each sub-pixel may include at least one light emitting element EL, and FIG. 5 shows three of the light emitting elements EL that emit light having three different colors, i.e., red, green, and blue.

Each first electrode AE may correspond to an associated sub-pixel. The pixel defining film PDL may be disposed on the first electrodes AE and may be patterned to expose portions of the first electrodes AE. Each first electrode AE may correspond to the anode electrode of the associated light emitting element EL. The first electrode AE may include a metal layer such as silver (Ag), magnesium (Mg), aluminum (Al), platinum (Pt), palladium (Pd), gold (Au), nickel (Ni), neodymium (Nd), iridium (Ir), chromium (Cr), and an alloy thereof, and/or a conducting oxide such as indium tin oxide (IZO), indium zinc oxide (IZO), zinc oxide (ITO), and zinc oxide (ITO).

The pixel defining film PDL may overlap the non-light emitting area NEM. The pixel defining film PDL may include an organic insulating layer including an organic material. As the organic material, one or more of an acryl resin, an epoxy resin, a phenolic resin, a polyamide resin, and a polyimide resin may be selected. The pixel defining film PDL may include a light absorption material. The pixel defining film PDL may include a light absorbing agent to absorb light introduced from the outside. For example, the pixel defining film PDL may include a carbon-based black pigment. Alternatively, the pixel defining film PDL may include an opaque metallic material such as chromium (Cr), molybdenum (Mo), an alloy (MoTi) of molybdenum and titanium, tungsten (W), vanadium (V), niobium (Nb), tantalum (Ta), manganese (Mn), cobalt (Co), or nickel (Ni), which has a high light absorption rate. However, the pixel defining film PDL is not limited to these examples.

The light emitting layer EML may be disposed to overlap an area in which at least a portion of the pixel defining film PDL is removed to expose the first electrode AE. The light emitting layer EML may include an organic light emitting layer. Depending on the organic material included in the light emitting layer EML, the light emitting layer EML may emit light in a first wavelength band (for example, a red wavelength band) through a first light emitting area EMA_R, may emit light in a second wavelength band (for example, a green wavelength band) through a second light emitting area EMA_G, or may emit light in a third wavelength band (for example, a blue wavelength band) through a third light emitting area EMA_B.

In the illustrated embodiment, one light emitting area (for example, the second light emitting area EMA_G) may be different from the other two light emitting areas. For example, an area of the second light emitting area EMA_G may be smaller than areas of the first light emitting area EMA_R and the third light emitting area EMA_B. However, the present disclosure is not limited thereto. For example, all areas of the first to third light emitting areas EMA_R, EMA_G, and EMA_B may be the same.

The second electrode CE may be disposed on the light emitting layer EML. The second electrode CE may be entirely film-formed to cover the light emitting area EMA and the non-light emitting area NEM. The second electrode CE may correspond to the cathode electrode of each of the light emitting elements EL. The second electrode CE may include a metal layer made of silver (Ag), magnesium (Mg), aluminum (Al), platinum (Pt), palladium (Pd), gold (Au), nickel (Ni), neodymium (Nd), iridium (Ir), or chromium (Cr) and/or a light-transmitting conductive layer made of ITO, IZO, ZnO, or ITZO. For example, the second electrode CE may be formed of a multilayer of two or more layers including a thin metal layer. For example, the second electrode CE may include a triple layer of ITO/Ag/ITO.

In some embodiments, the light emitting element EL may further include a hole transport layer (not shown) disposed between the first electrode AE and the light emitting layer EML and an electron transport layer (not shown) disposed between the second electrode CE and the light emitting layer EML.

The encapsulation layer TFE may be disposed on the second electrode CE. The encapsulation layer TFE may have a stacked structure in which an inorganic material, an organic material, and an inorganic material are sequentially film-formed. The encapsulation layer TFE may be formed by sequentially film-forming a first inorganic encapsulation layer IOL1 including an inorganic material, an organic encapsulation layer OL including an organic material, and a second inorganic encapsulation layer IOL2 including an inorganic material. The encapsulation layer TFE may protect a lower light emitting elements EL (for example, the light emitting layer EML) from external moisture and/or oxygen.

The conductive pattern CP may be disposed on the encapsulation layer TFE. The conductive pattern CP may form the touch electrodes TE and the connection wires CL.

The insulating layer INS may insulate the touch electrodes TE from each other. The insulating layer INS may insulate the connection wires CL from each other. Referring to FIG. 4 and FIG. 5 together, the touch electrodes TE may be insulated from each other, and the connection wires CL may be insulated from each other by the insulating layer INS.

The light blocking member BM may be disposed on the insulating layer INS. The light blocking member BM may overlap the conductive pattern CP. The light blocking member BM may absorb or block light introduced from the outside. The light blocking member BM may include an organic light blocking material. For example, the organic light blocking material may include at least one of carbon black (CB) and titanium black (TiBK) but is not limited thereto.

The light blocking member BM may define a plurality of light blocking areas and light transmitting openings. In the embodiment, the light blocking member BM may be formed by a patterning process or a printing process using a mask. The light transmitting openings may overlap the light emitting area EMA.

The color filter CF may be disposed at positions corresponding to the light transmitting openings. For example, the color filter CF may be disposed to fill the light transmitting openings. In the embodiment, the color filter CF may cover at least a portion of the light blocking member BM. According to a color of light emitted from the light emitting area EMA, the color filter CF may be one of a first color filter CF_R, a second color filter CF_G, and a third color filter CF_B.

In the illustrated embodiment, areas of the light blocking member BM may be wider than underlying areas of the conductive pattern CP. For example, a width of the light blocking member BM may be wider than at least one of the conductive pattern CP forming the touch electrode TE and the conductive pattern CP forming the connection wire CL. That is, a portion of the light blocking member BM does not overlap the conductive pattern CP, and the conductive pattern CP may entirely overlap the light blocking member BM.

Figure 6:
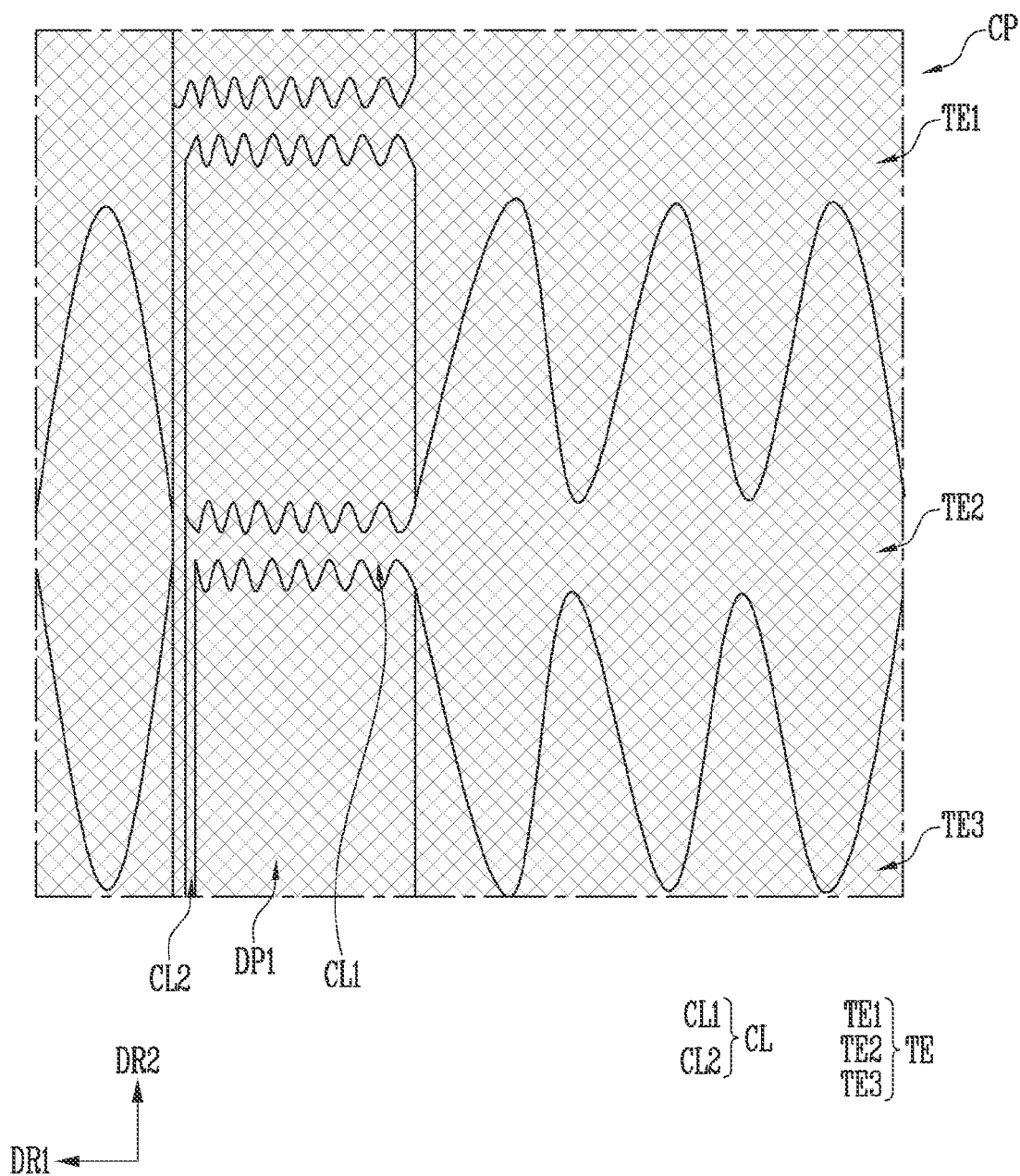
FIG. 6 illustrates an enlarged view of a first area of FIG. 4.
Figure 7:
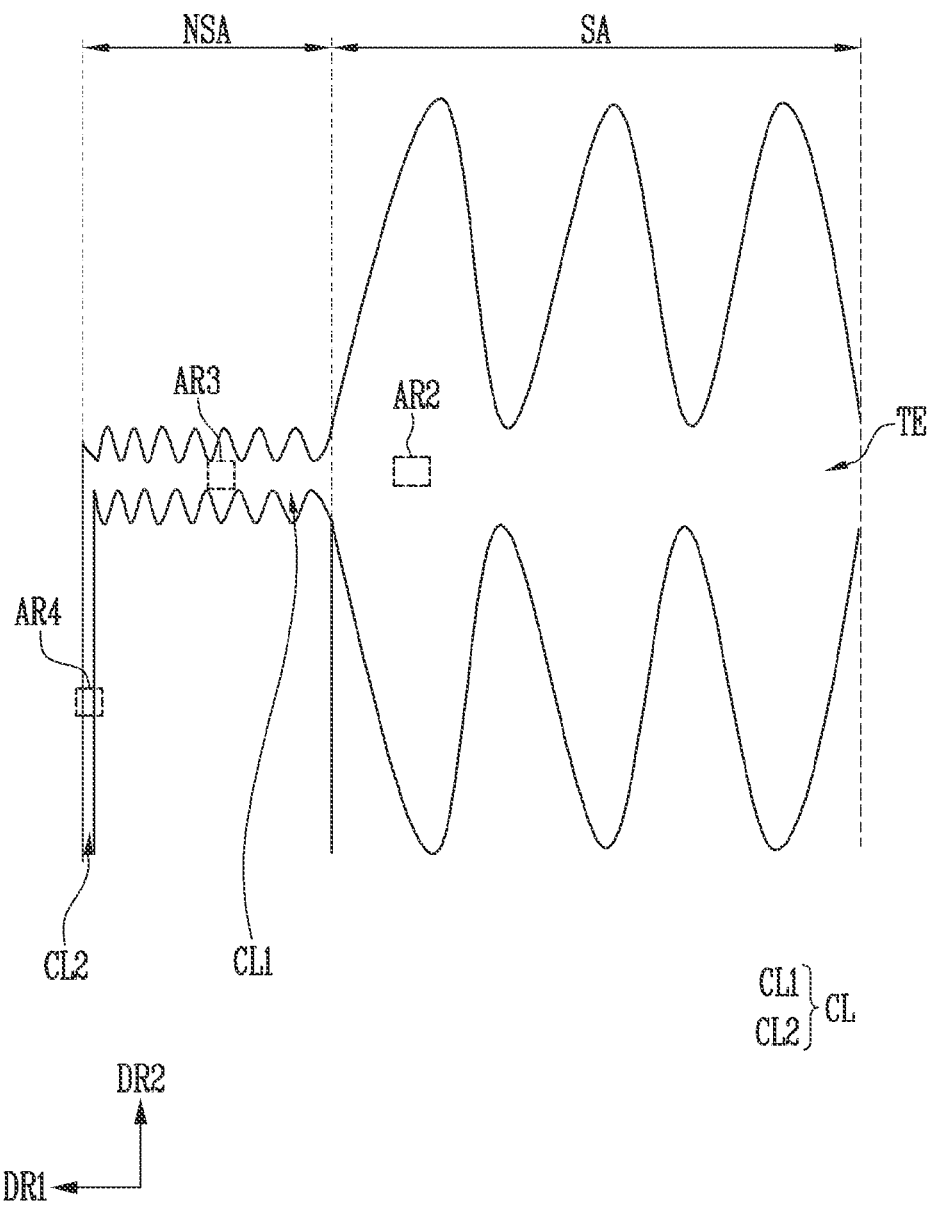
FIG. 7 illustrates a touch electrode and a connection wire connected to the touch electrode in FIG. 6.

FIG. 6 illustrates an enlarged view of a first area of FIG. 4, and FIG. 7 illustrates one touch electrode and a connection wire connected to the one touch electrode in FIG. 6.

FIG. 6 illustrates a conductive pattern CP in a first area AR1 of FIG. 4. In the illustrated embodiment, the conductive pattern CP may be a conductive layer or mesh as described further below that a cutting line (or cutting surface) separates into multiple conductive areas. In particular, the touch electrodes TE overlapping the first area AR1 may be separated by the cutting line (or a cutting surface). As shown in FIG. 6, a first touch electrode TE1 may be disposed at the top (in the second direction DR2) of the first area AR1, and the cutting line (or cutting surface) separates the first touch electrode TE1 from a second touch electrode TE2. For example, as shown in FIG. 6, the second touch electrode TE2 may be separated in a direction opposite to the second direction DR2 from the first touch electrode by a distance corresponding to the cutting line (or cutting surface) between the first touch electrode TE1 and the second touch electrode TE2. Similarly, the second touch electrode TE2 may be separated in the second direction DR2 from a third touch electrode TE3 by a distance corresponding to the cutting line (or cutting surface) between the second touch electrode TE2 and the third touch electrode TE3.

FIG. 7 illustrates boundaries of the second touch electrode TE2 of FIG. 6 and connection wires CL1 and CL2 connected to the second touch electrode TE2.

Referring to FIG. 6 and FIG. 7, the conductive pattern CP may be formed in a mesh shape that the cutting line (or the cutting surface) separates into components such as the touch electrodes TE and the connection wires CL. The conductive pattern CP may thus form the touch electrodes TE and the connection wires CL. Each connection wire CL may be adjacent to or extend (in the first direction DR1) from its associated touch electrode TE. The touch electrodes TE may reside in a sensing area SA of the conductive pattern CP, and the connection wires CL may reside in a trace area NSA of the conductive pattern CP.

One edge of each of the touch electrode TE may have one or more protruding portions that protrude in the second direction DR2 and one or more recessed portions that are recessed in a direction opposite to the second direction DR2 relative to the protruding portions. The opposite edge of the touch electrode TE may have one or more protruding portions that protrude in the opposite direction from the second direction DR2 and one or more recessed portions that are recessed in the second direction DR2 relative to the protruding portions. For example, edges of each of the touch electrodes TE may have a sawtooth shape or sinusoidal shape.

Each connection wire CL may include the first connection wire CL1 extending in the first direction DR1 and the second connection wire CL2 extending in the second direction DR2. For example, the first connection wire CL1 may be directly connected to the touch electrode TE, and the second connection wire CL2 may connect the first connection wire CL1 to the pad portion (PAD in FIG. 4).

A portion of the connection wire CL may have one or more protruding portions that protrude in the second direction DR2. A portion of the connection wire CL may have one or more protruding portions that protrude in the opposite direction of the second direction DR2. For example, one or more edges of the connection wire CL1 may have a sawtooth shape or sinusoidal shape.

A first dummy pattern DP1 may be included between the conductive patterns CP forming the first connection wire CL1. The first dummy pattern DP1 may not be connected to the touch electrode TE and the connection wire CL. For example, the first dummy pattern DP1 may be insulated from the conductive pattern CP forming the touch electrode TE and the conductive pattern CP forming the connection wire CL.

Figure 8:
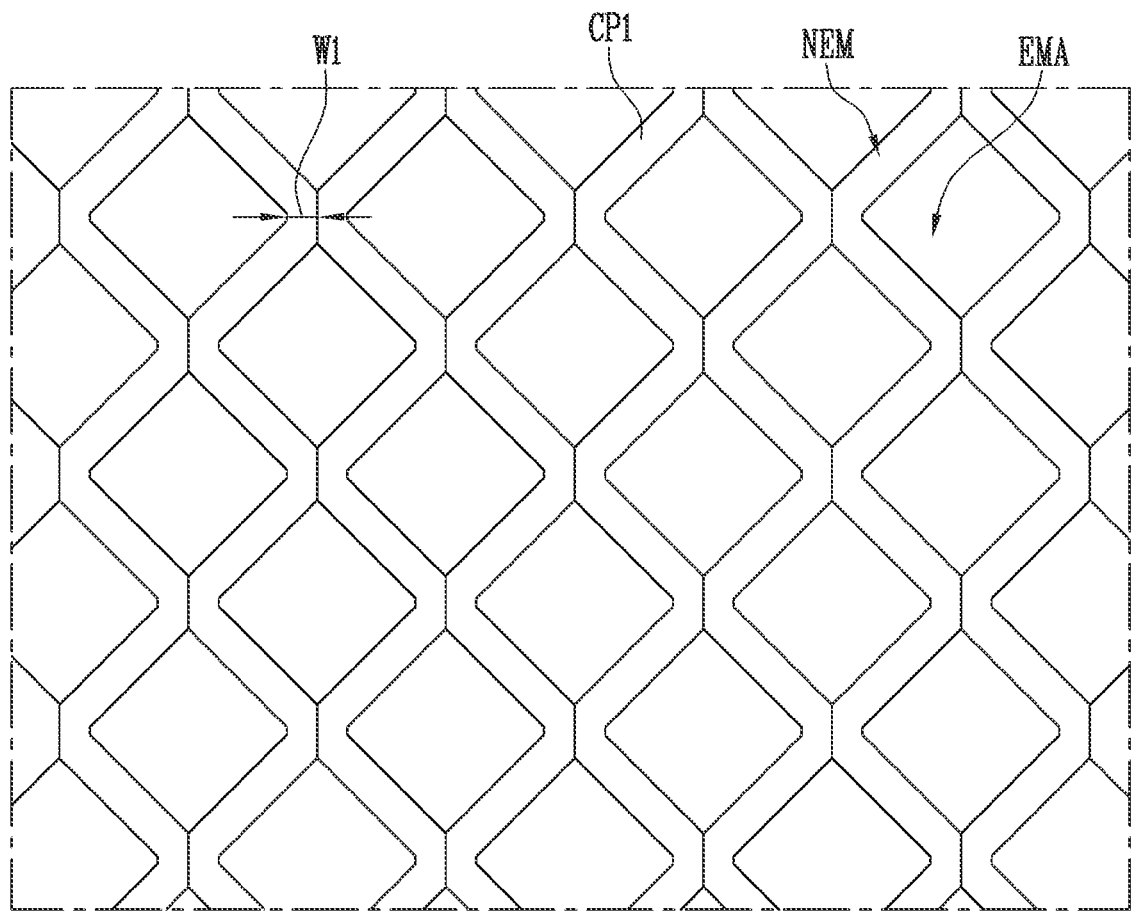
FIG. 8 illustrates an enlarged view of a second area of FIG. 7.

The conductive pattern CP in the touch electrode TE of FIG. 7 may form meshes with different geometries in different areas. FIG. 8 illustrates an enlarged view of a second area AR2 of FIG. 7, FIG. 8 illustrates an enlarged view of a third area AR3 of FIG. 7, and FIG. 10 illustrates an enlarged view of a fourth area AR4 of FIG. 7. More specifically, FIG. 8 illustrates a portion of the conductive pattern CP in a second area AR2, FIG. 9 illustrates a portion of the conductive pattern CP in a third area AR3, and FIG. 10 illustrates a portion of the conductivity pattern CP of a fourth area AR4.

Referring to FIG. 7 to FIG. 10, conductive patterns CP1 and CP2 in the conductive pattern CP may overlap the non-light emitting area NEM. In addition, some of the openings defined by the conductive patterns CP1 and CP2 may overlap the light emitting area EMA. For better understanding and ease of description, FIG. 8 illustrates that the openings defined by the conductive patterns CP1 and CP2 overlap the light emitting area EMA, but as shown in FIG. 5, the openings defined by the conductive patterns CP1 and CP2 may be wider than the light emitting area EMA.

Figure 9:
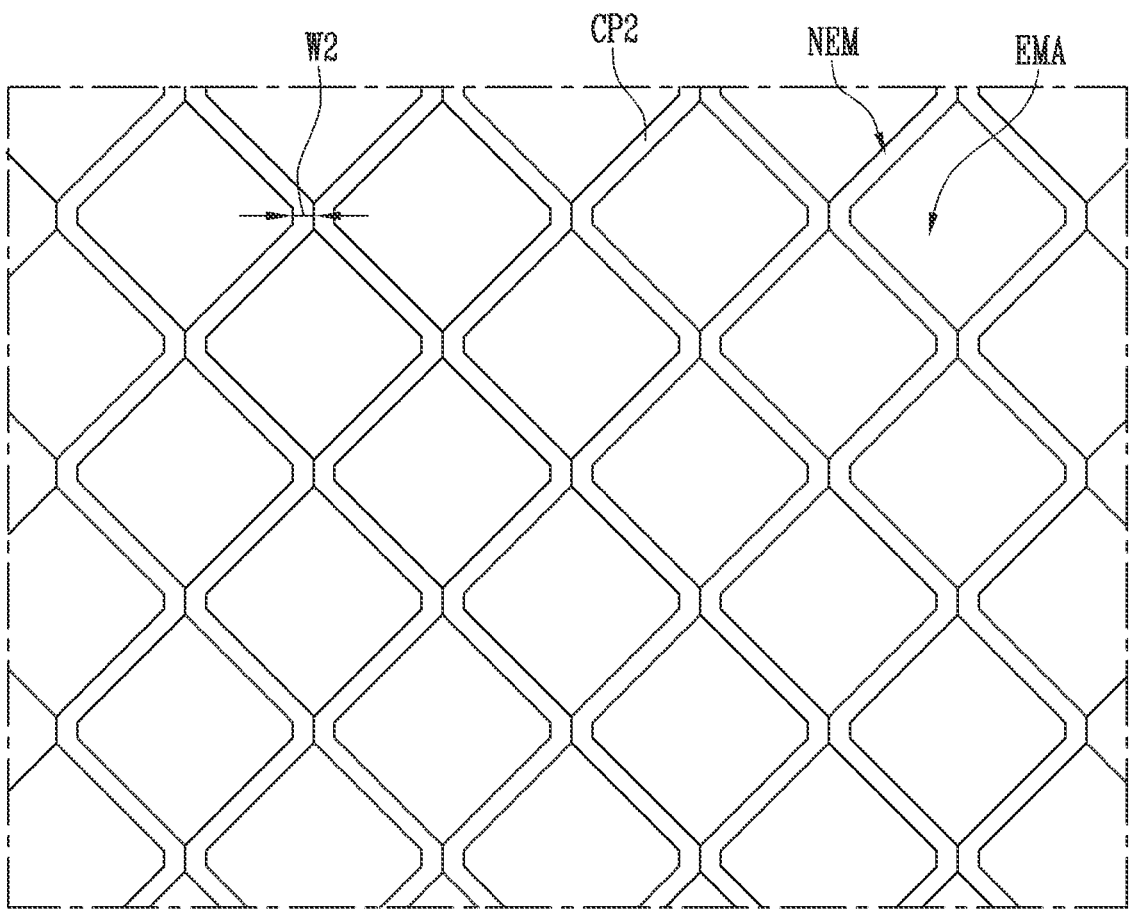
FIG. 9 illustrates an enlarged view of a third area of FIG. 7.
Figure 10:
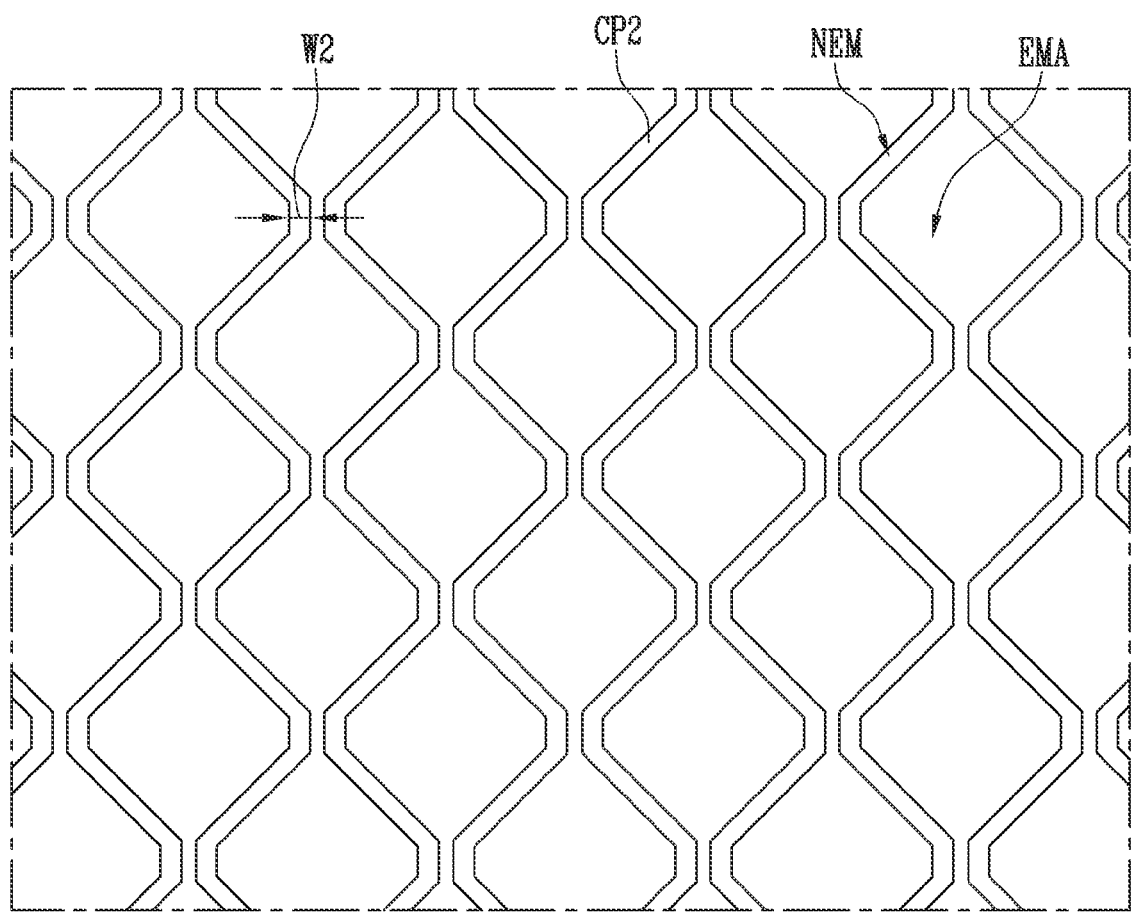
FIG. 10 illustrates an enlarged view of a fourth area of FIG. 7.

FIGS. 8 and 9 show an example in which each of the first conductive patterns CP1 and each of the second conductive patterns CP2 has a zigzag shape and generally extend in the second direction DR2. A width W1 of each of the first conductive patterns CP1 forming the touch electrode TE may be different from a width W2 of each of the second conductive patterns CP2 forming the connection wire CL. The width W1 of the first conductive pattern CP1 may be wider than the width W2 of the second conductive pattern CP2. For example, the width W1 of the first conductive pattern CP1 may be larger than about 3 μm, and the width W2 of the second conductive pattern CP2 may be smaller than about 3 μm.

The first conductive patterns CP1 form the touch electrode TE, and the larger the width W1 of the first conductive patterns CP1 may provide a larger capacitance between the touch electrode TE and an object (for example, a human finger). In addition, the second conductive patterns CP2 form the connection wire CL, and the narrower the width W2 of the second conductive patterns CP2 may provide a lower capacitance between the connection wire CL and an underlying cathode electrode (for example, the second electrode CE in FIG. 5). The touch sensitivity may increase as the capacitance between the touch electrode TE and an object (for example, a human finger) increases. In addition, the touch sensitivity may increase as the capacitance between the touch electrode TE or connection wire CL and the cathode electrode (for example, the second electrode CE in FIG. 5) decreases. Accordingly, the touch sensitivity may be improved by increasing the width W1 of the first conductive patterns CP1 and decreasing the width W2 of the second conductive patterns CP2.

Referring to FIG. 7 and FIG. 8, at least some of the first conductive patterns CP1 may be in contact with each other. Since the touch sensing signal is provided from the touch electrode TE to the first connection wire CL1, a first set of the first conductive patterns CP1 extending in the second direction DR2 may contact each other to provide electrical conduction in the first direction DR1. In an embodiment, a second set of the first conductive patterns CP1 different from the first set thereof may be spaced apart from each other like the second conductive pattern CP2 forming the second connection wire CL2 as described further below.

Referring to FIG. 7 and FIG. 9, at least some of the second conductive patterns CP2 forming the first connection wire CL1 may be in contact with each other. Since the touch sensing signal is provided from the first connection wire CL1 to the second connection wire CL2, some of the second conductive patterns CP2 extending in the second direction DR2 forming the first connection wire CL1 may be in contact with each other to provide electrical conduction in the first direction DR1.

Referring to FIG. 7 and FIG. 10, at least some of the second conductive patterns CP2 forming the second connection wire CL2 may be spaced apart from each other. Since the second connection wire CL2 extends in the second direction DR2 to connect to the pad portion PAD, the second conductive patterns CP2 extending in the second direction DR2 forming the second connection wire CL2 do not need to and may not contact each other.

Figure 12:
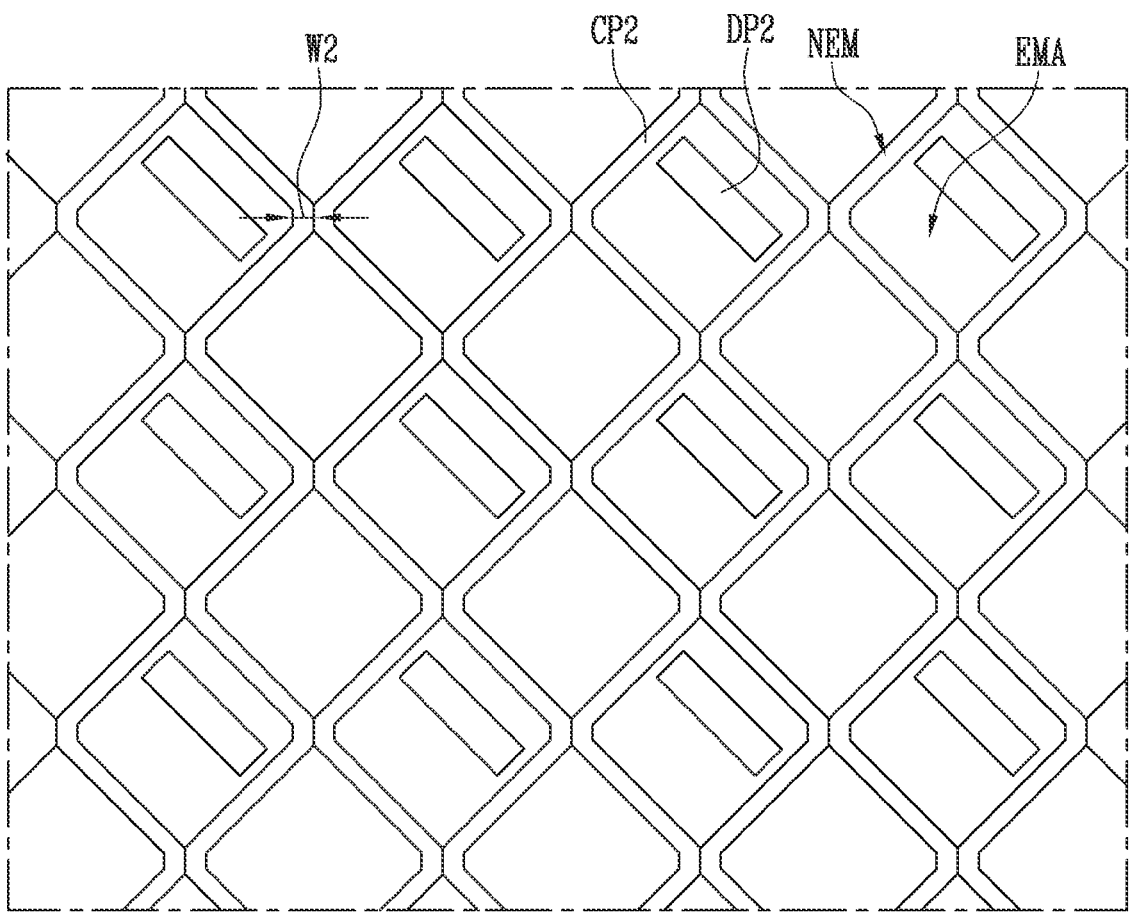
FIG. 12 illustrates a second conductive pattern forming a first connection wire of the display device of FIG. 11.
Figure 13:
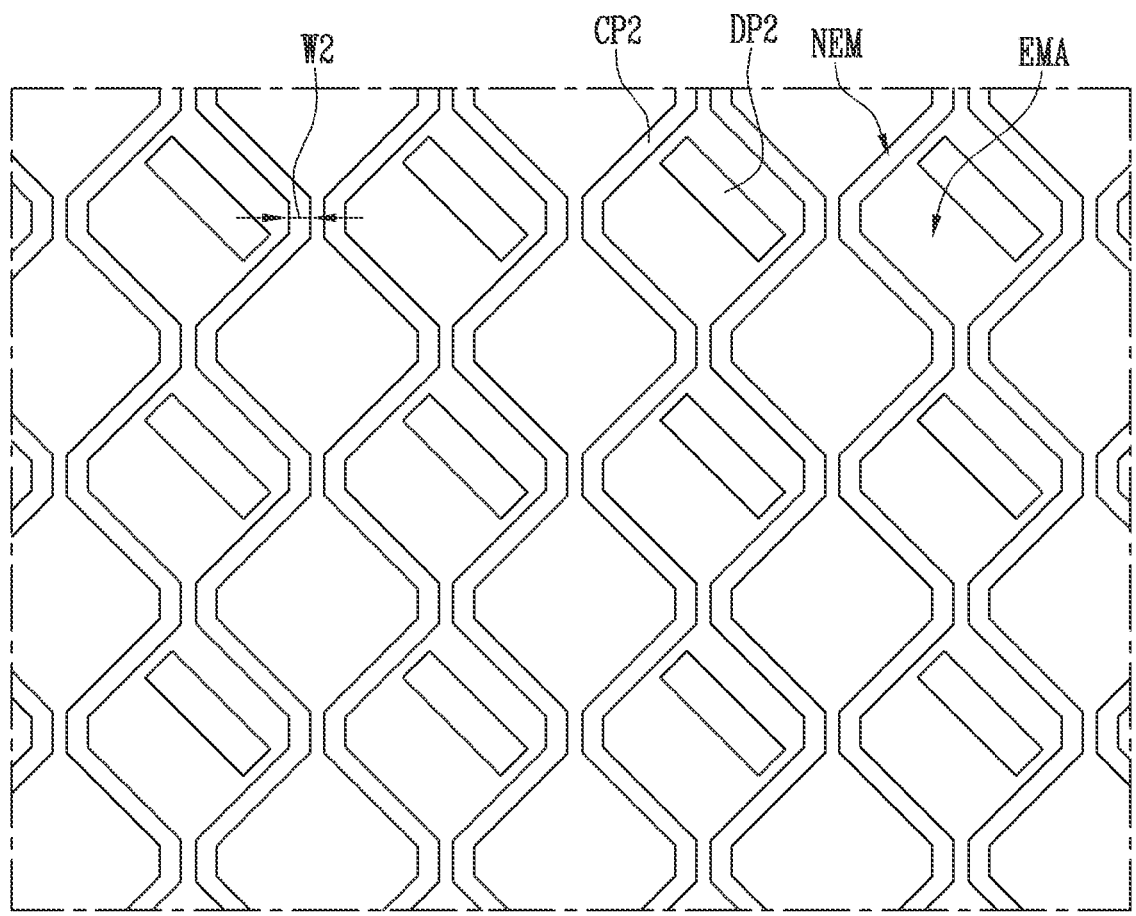
FIG. 13 illustrates a second conductive pattern forming a second connection wire of the display device of FIG. 11.

FIG. 11 illustrates a first conductive pattern that may be used in a touch electrode of a display device according to an embodiment of the present disclosure, FIG. 12 illustrates a second conductive pattern that may be used in a first connection wire connected to the touch electrode of FIG. 11, and FIG. 13 illustrates a second conductive pattern that may be used in a second connection wire connected to the first connection wire of FIG. 11.

Since a display device using the conductive patterns illustrated in FIGS. 11, 12, and 13 may be substantially the same as the configuration of the display device described above, except for an additional pattern AP and a second dummy pattern DP2, FIGS. 11, 12, and 13 use the same reference numbers and reference symbols for the same or similar constituent elements, and duplicate descriptions may be omitted below.

Referring to FIG. 8 to FIG. 10 and FIG. 11 to FIG. 13, unlike FIGS. 8 to 10, the conductive pattern CP in FIGS. 11 to 13 may be formed using mesh forms to which the additional pattern AP or the second dummy pattern DP2 have been added. The first conductive patterns CP1 in FIG. 11 may include the additional pattern AP overlapping the light emitting area EMA. The additional pattern AP may contact or be part of an adjacent first conductive pattern CP1. The touch panel may further include a second dummy pattern DP2 overlapping the light emitting area EMA in the trace area NSA. For example, the second dummy pattern DP2 may be generated by cutting the additional pattern AP from the conductive pattern CP1.

The second dummy pattern DP2 may not be connected to the connection wire CL. For example, the second dummy pattern DP2 may be insulated from the second conductive pattern CP2 forming the connection wire CL.

Figure 14:
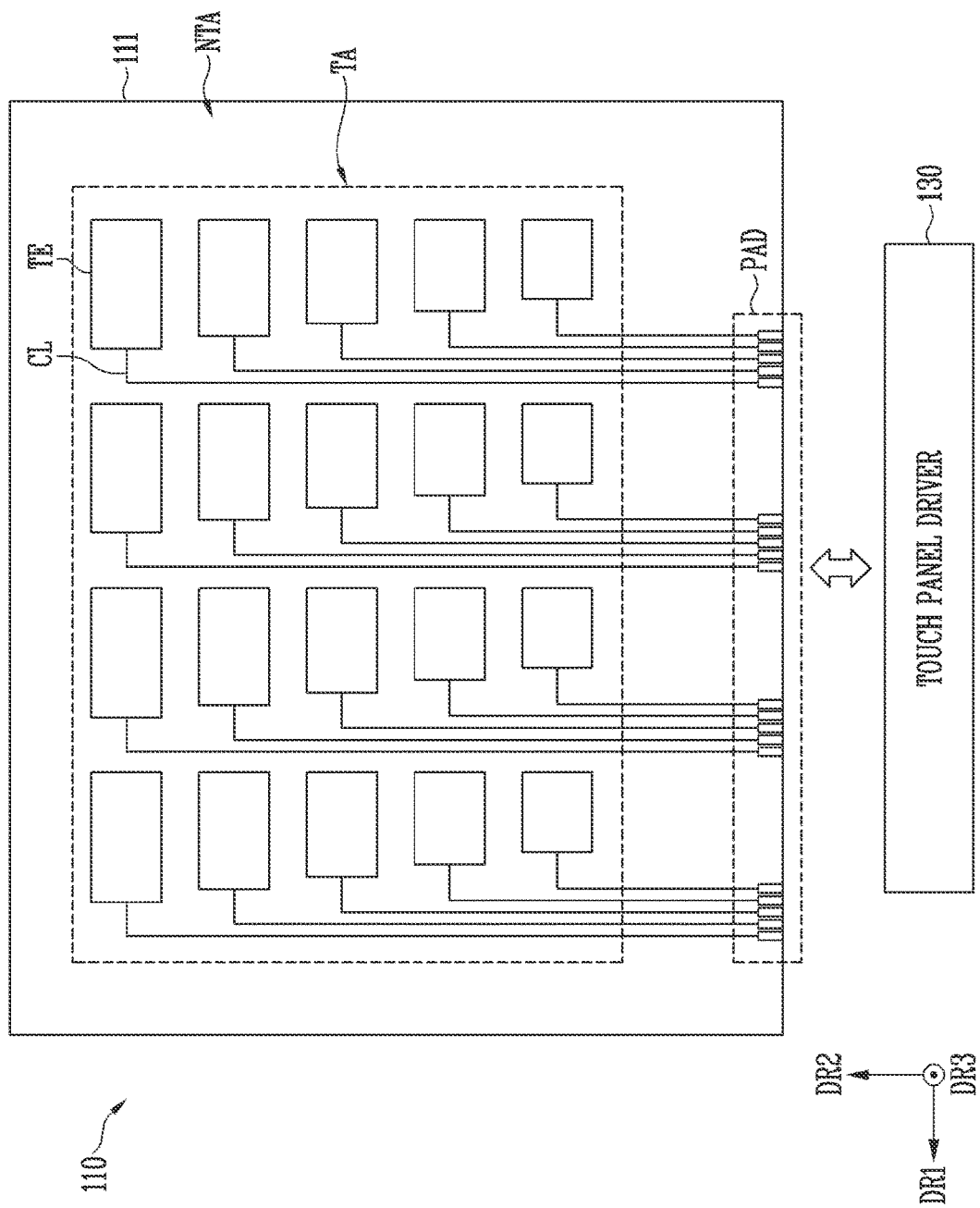
FIG. 14 illustrates a block diagram of a touch panel according to an embodiment of the present disclosure.

FIG. 14 illustrates a block diagram of a touch panel according to an embodiment of the present disclosure.

Since the touch panel of FIG. 14 is substantially the same as the touch panel in FIG. 4, except for the configuration of the touch electrodes TE and the connection wires CL, the same reference numbers and reference symbols are used for the same or similar constituent elements, and duplicate descriptions may be omitted below.

Referring to FIG. 14, the touch electrodes TE and the connection wires CL may be formed on the same layer. The sizes of the touch electrodes TE may gradually decrease in a direction opposite to the second direction DR2. Since the touch electrode TE and the connection wire CL are formed on the same layer, the size of the touch electrode TE may gradually decrease in a direction opposite to the second direction DR2 in order to provide space for the connection wire CL while allowing most of the touch electrodes to be more closely spaced in the first direction DR1.

Figure 15:
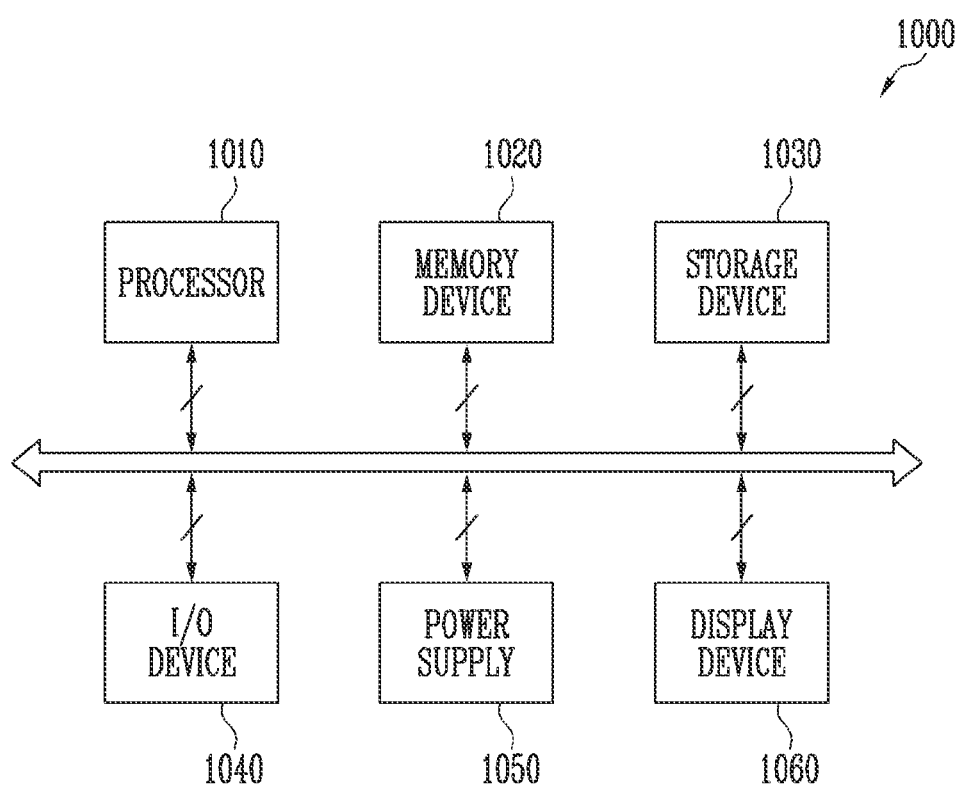
FIG. 15 illustrates a block diagram of an electronic device according to an embodiment of the present disclosure.

FIG. 15 illustrates a block diagram of an electronic device according to embodiments of the present disclosure.

Referring to FIG. 15, an electronic device 1000 may include a processor 1010, a memory device 1020, a storage device 1030, an input/output device 1040, a power supply device 1050, and a display device 1060. In this case, the display device 1060 may be the display device of FIG. 1. In addition, the electronic device 1000 may further include several ports capable of communicating with a video card, a sound card, a memory card, a USB device, and the like, or communicating with other systems. In the illustrated embodiment, the electronic device 1000 may be implemented as a smart phone. However, this is an example, and the electronic device 1000 is not limited thereto. For example, the electronic device 1000 may be implemented as a mobile phone, a video phone, a smart pad, a smart watch, a tablet PC, a vehicle navigation system, a computer monitor, a laptop computer, a head mounted display device, a television, or the like.

The processor 1010 may perform specific calculations or tasks. In some embodiments, the processor 1010 may be a micro-processor, a central processing unit, an application processor, or the like. The processor 1010 may be connected to other constituent elements through an address bus, a control bus, and a data bus. In some embodiments, the processor 1010 may also be connected to an extension bus such as a peripheral component interconnect (PCI) bus.

The memory device 1020 may store data necessary for operations of the electronic device 1000. For example, the memory device 1020 may include non-volatile memory devices such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, and a ferroelectric random access memory (FRAM) device, and/or volatile memory devices such as a dynamic random access memory (DRAM) device, a static random access memory (SRAM) device, and a mobile DRAM device.

The storage device 1030 may include a solid-state drive (SSD), a hard disk drive (HDD), a CD-ROM, and the like.

The input/output device 1040 may include input devices such as a keyboard, a keypad, a touch pad, a touchscreen, mouse, and the like, and output devices such as a speaker, a printer, and the like. In some embodiments, the display device 1060 may be included in the input/output device 1040.

The power supply device 1050 may supply power necessary for the operation of the electronic device 1000. For example, the power supply device 1050 may be a power management integrated circuit (PMIC).

The display device 1060 may display an image corresponding to visual information of the electronic device 1000. In this case, the display device 1060 may be an organic light emitting display device or a quantum dot light emitting display device but is not limited thereto. The display device 1060 may be connected to other constituent elements through the buses or other communication links.

The present disclosure may be applied to a display device and an electronic device including the same. For example, the present disclosure may be applied to a digital TV, a 3D TV, a mobile phone, a smart phone, a tablet computer, a VR device, a PC, a home electronic device, a laptop computer, a PDA, a PMP, a digital camera, a music player, a portable game console, a navigation, and the like.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:

1. A touch panel comprising:
a base substrate;
a plurality of touch electrodes disposed on the base substrate; and
a plurality of connection wires disposed on the base substrate, each of the plurality of connection wires connecting each of the plurality of touch electrodes to a touch panel driver,
wherein each of the plurality of touch electrodes includes a plurality of first conductive patterns, and each of the plurality of connection wires includes a plurality of second conductive patterns, and
wherein a width of one of the plurality of first conductive patterns included in each of the plurality of touch electrodes is different from a width of one of the plurality of second conductive patterns included in each of the plurality of connection wires.

2. The touch panel of claim 1, wherein
the width of one of the plurality of first conductive patterns is wider than the width of one of the plurality of second conductive patterns.

3. The touch panel of claim 1, wherein
the width of one of the plurality of first conductive patterns is greater than about 3 μm, and
the width of one of the plurality of second conductive patterns is smaller than about 3 μm.

4. The touch panel of claim 1, further comprising:
a light blocking member disposed on each of the plurality of touch electrodes; and
a color filter disposed at a position corresponding to an opening defined by the light blocking member.

5. The touch panel of claim 4, wherein
a width of the light blocking member is greater than at least one of the width of the plurality of first conductive patterns and the width of the plurality of second conductive patterns.

6. The touch panel of claim 1, wherein
each of the plurality of connection wires is adjacent to each of the plurality of touch electrodes in a first direction, and
a portion of each of the plurality of touch electrodes further includes a protruding portion that protrudes in a second direction crossing the first direction.

7. The touch panel of claim 1, wherein
each of the plurality of connection wires is adjacent to each of the plurality of touch electrodes in a first direction, and
a portion of each of the plurality of connection wires further includes a protruding portion that protrudes in a second direction crossing the first direction.

8. The touch panel of claim 1, further comprising
a dummy pattern disposed between the plurality of second conductive patterns.

9. The touch panel of claim 1,
wherein at least some of the plurality of first conductive patterns are in contact with each other.

10. The touch panel of claim 1, wherein
each of the plurality of connection wires includes a first connection wire extending in a first direction and a second connection wire extending in a second direction crossing the first direction, and
at least some of the plurality of second conductive patterns included in the first connection wire are in contact with each other.

11. The touch panel of claim 1, wherein
each of the plurality of connection wires includes a first connection wire extending in a first direction and a second connection wire extending in a second direction crossing the first direction, and
at least some of the plurality of second conductive patterns included in the second connection wire are spaced apart from each other.

12. The touch panel of claim 1, wherein
the plurality of first conductive patterns includes an additional pattern overlapping a light emitting area.

13. The touch panel of claim 1, wherein
the plurality of second conductive patterns includes a dummy pattern overlapping a light emitting area in a trace area.

14. The touch panel of claim 1,
wherein sizes of each of the plurality of touch electrodes are the same.

15. The touch panel of claim 1, wherein the plurality of touch electrodes and the plurality of connection wires are formed on the same layer.

16. The touch panel of claim 1, wherein
the plurality of touch electrodes and the plurality of connection wires are formed on different layers.

17. The touch panel of claim 1,
wherein each of the plurality of connection wires is adjacent to the touch panel driver in a second direction, and
sizes of each of the plurality of touch electrodes decrease in a direction opposite to the second direction.

18. A display device comprising:
a display panel;
a touch panel provided on one surface of the display panel;
a display panel driver that drives the display panel; and
a touch panel driver that drives the touch panel, wherein the touch panel includes:
a base substrate;
a plurality of touch electrodes disposed on the base substrate; and
a plurality of connection wires disposed on the base substrate, each of the plurality of connection wires connecting each of the plurality of touch electrodes to the touch panel driver,
wherein each of the plurality of touch electrodes includes a plurality of first conductive patterns, and each of the plurality of connection wires includes a plurality of second conductive patterns, and
wherein a width of one of the plurality of first conductive patterns included in each of the plurality of touch electrodes is different from a width of one of the plurality of second conductive patterns included in each of the plurality of connection wires.

19. The display device of claim 18, wherein
the width of one of the plurality of first conductive patterns is wider than the width of one of the plurality of second conductive patterns.

20. The display device of claim 18, wherein
the touch panel further includes:
a light blocking member disposed on each of the plurality of touch electrodes; and
a color filter disposed at a position corresponding to an opening defined by the light blocking member, and
a width of the light blocking member is greater than at least one of the width of the plurality of first conductive patterns and the width of the plurality of second conductive patterns.

* * * * *